(12) United States Patent
Chen et al.

(10) Patent No.: US 10,854,511 B2
(45) Date of Patent: Dec. 1, 2020

(54) METHODS OF LOWERING WORDLINE RESISTANCE

(71) Applicant: Applied Materials, Inc., Santa Clara, CA (US)

(72) Inventors: Yihong Chen, San Jose, CA (US); Yong Wu, Sunnyvale, CA (US); Chia Cheng Chin, Santa Clara, CA (US); Xinliang Lu, Fremont, CA (US); Srinivas Gandikota, Santa Clara, CA (US); Ziqing Duan, San Jose, CA (US); Abhijit Basu Mallick, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/000,431

(22) Filed: Jun. 5, 2018

(65) Prior Publication Data

US 2018/0350606 A1    Dec. 6, 2018

Related U.S. Application Data

(60) Provisional application No. 62/515,533, filed on Jun. 5, 2017.

(51) Int. Cl.
*H01L 21/336* (2006.01)
*H01L 21/768* (2006.01)
(Continued)

(52) U.S. Cl.
CPC .. *H01L 21/76877* (2013.01); *H01L 21/02274* (2013.01); *H01L 21/02532* (2013.01); *H01L 21/02592* (2013.01); *H01L 21/28061* (2013.01); *H01L 21/28194* (2013.01); *H01L 21/28556* (2013.01); *H01L 21/32135* (2013.01); *H01L 21/32136* (2013.01); *H01L 21/763* (2013.01); *H01L 21/76843* (2013.01);
(Continued)

(58) Field of Classification Search
CPC ......... H01L 21/28194; H01L 27/11582; H01L 27/11556; H01L 21/28061; H01L 21/763; H01L 21/76877; H01L 21/21; H01L 21/02274; H01L 21/02532; H01L 21/02592; H01L 21/28568; H01L 21/28556; H01L 21/32135; H01L 21/76843; H01L 21/32136; G11C 8/14
See application file for complete search history.

(56) References Cited

U.S. PATENT DOCUMENTS 9,960,045 B1 * 5/2018 Purayath ............ H01L 29/0649
10,020,314 B1 * 7/2018 Baraskar ........... H01L 27/11519
(Continued)

FOREIGN PATENT DOCUMENTS

KR    101274202 B1    6/2013

OTHER PUBLICATIONS

PCT International Search Report and Written Opinion in PCT/US2018/036060 dated Sep. 21, 2018, 11 pages.

*Primary Examiner* — Shouxiang Hu
(74) *Attorney, Agent, or Firm* — Servilla Whitney LLC

(57) ABSTRACT

Methods for forming 3D-NAND devices comprising recessing a poly-Si layer to a depth below a spaced oxide layer. A liner is formed on the spaced oxide layer and not on the recessed poly-Si layer. A metal layer is deposited in the gaps on the liner to form wordlines.

14 Claims, 5 Drawing Sheets

(51) Int. Cl.
    *H01L 21/28*     (2006.01)
    *H01L 21/763*     (2006.01)
    *H01L 27/11556*     (2017.01)
    *H01L 27/11582*     (2017.01)
    *H01L 21/02*     (2006.01)
    *H01L 21/3213*     (2006.01)
    *H01L 21/285*     (2006.01)
    *G11C 8/14*     (2006.01)

(52) U.S. Cl.
    CPC .. *H01L 21/76879* (2013.01); *H01L 27/11556* (2013.01); *H01L 27/11582* (2013.01); *G11C 8/14* (2013.01)

(56) References Cited

U.S. PATENT DOCUMENTS

| | | | |
|---|---|---|---|
| 2010/0181610 A1* | 7/2010 | Kim | H01L 27/11578 257/314 |
| 2011/0256680 A1 | 10/2011 | Park et al. | |
| 2014/0151774 A1 | 6/2014 | Rhie | |
| 2015/0076585 A1* | 3/2015 | Pachamuthu | H01L 27/11551 257/315 |
| 2015/0380424 A1 | 12/2015 | Makala et al. | |
| 2016/0099250 A1* | 4/2016 | Rabkin | H01L 27/11582 257/66 |
| 2016/0148945 A1 | 5/2016 | Sharangpani et al. | |

\* cited by examiner

METHODS OF LOWERING WORDLINE RESISTANCE

This application claims priority to U.S. Provisional Application No. 62/515,533, filed Jun. 5, 2017, the entire disclosure of which is hereby incorporated by reference herein.

TECHNICAL FIELD

The present disclosure relates generally to methods of depositing and processing thin films. In particular, the disclosure relates to processes for filling trenches in substrates.

BACKGROUND

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Gate-first process flow for 3D-NAND manufacturing is of interest due to benefits in device performance and flexibility. The manufacturing process starts with a film stack with alternating $SiO_2$ and poly-Si (OP stack). Such a stack is patterned to build the memory strings. A wordline slit etch is applied to define the memory arrays and a conformal dielectric layer is deposited to passivate the array. One major disadvantage of this OP stack-based 3D-NAND device is its high wordline resistance which results in large latency in device programming, reading and erasing. Due to the intrinsic semiconducting feature of poly-Si, it is very difficult to lower the wordline resistance to the level of metal lines (such as tungsten wordlines in gate-last process).

Therefore, there is a need in the art for methods for forming wordlines in 3D-NAND and similar devices with low resistance.

SUMMARY

One or more embodiments of the disclosure are directed to processing methods comprising providing a substrate surface with a plurality of spaced oxide layers with gaps between the spaced oxide layers and poly-Si layers in the gaps between the spaced oxide layers. The poly-Si layer is recessed a depth below a surface of the spaced oxide layers. A liner is formed on the spaced oxide layers and not on the recessed poly-Si layer. A metal layer is deposited in the gaps on the liner to form wordlines.

Additional embodiments of the disclosure are directed to processing methods comprising providing a substrate surface with a plurality of spaced oxide layers with gaps between the spaced oxide layers and poly-Si layers in the gaps between the spaced oxide layers. The poly-Si layer is recessed a depth below a surface of the spaced oxide layers. A liner is formed on the spaced oxide layers and the recessed poly-Si layer. A metal layer is deposited in the gaps on the liner to form wordlines. The liner is etched from the spaced oxide layers.

Further embodiments of the disclosure are directed to processing methods comprising providing a substrate surface with a plurality of spaced oxide layers with gaps between the spaced oxide layers and poly-Si layers in the gaps between the spaced oxide layers. The poly-Si layer is recessed to a depth below a surface of the spaced oxide layers. A TiN liner is formed on the spaced oxide layers and not on the recessed poly-Si layer, the liner having a thickness in the range of about 20 Å to about 50 Å. A tungsten layer is deposited in the gaps on the liner to form wordlines. The tungsten layer is deposited by exposing the substrate to a tungsten precursor and a reactant, the tungsten precursor comprises one or more of $WF_6$, $WCl_6$ or $WCl_5$ and the reactant comprises $H_2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
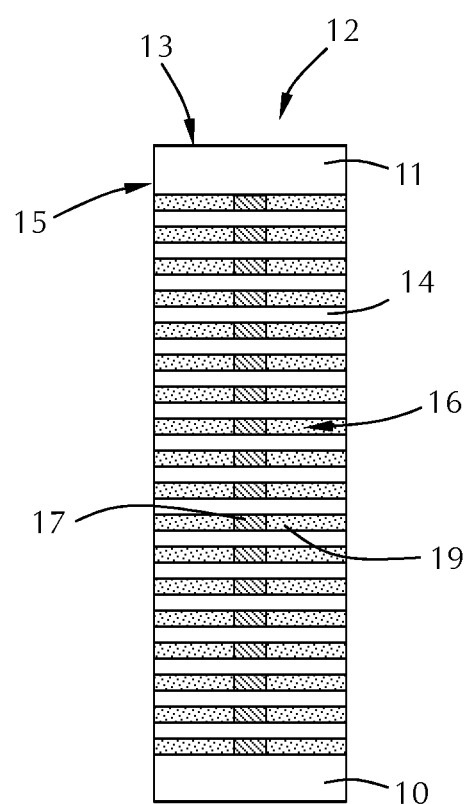
FIG. 1 shows a cross-sectional view of a 3D-NAND device in accordance with one or more embodiment of the disclosure.

FIG. 1 illustrates a portion of a 3D-NAND type device. A stack 12 of layers is formed between a source 10 and drain 11. The stack 12 has a plurality of oxide layers 14 that are spaced apart from each other to form gaps between the oxide layers 14 so that each gap forms a wordline or shell (or template) for a wordline 19 to be formed. The stack 12 has a top 13 and sides 15.

The stack 12 can have any suitable number of oxide layers 14 or gaps 16. In some embodiments, there are greater than or equal to about 10, 20, 30, 40, 50, 60, 70, 80, 90 or 100 gaps 16 formed in the stack 12 that can be used to form an equal number of wordlines 19. The number of the gaps 16 is measured on either side of the memory string 17 that connects all of the individual oxide layers 14. In some embodiments, the number of gaps 16 is a multiple of 2. In some embodiments, the number of gaps is equal to $2^n$ where n is any positive integer. In some embodiments, the number of gaps 16 is about 96.

Figure 2A:
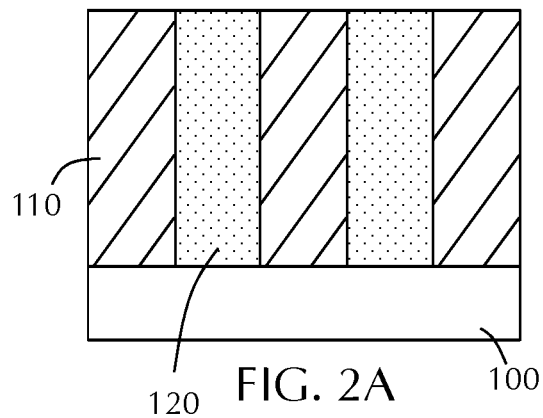
FIGS. 2A through 2F show a cross-sectional schematic of a process in accordance with one or more embodiments of the disclosure.

The embodiments illustrated in the Figures show an expanded view of three oxide layers and two gaps or wordlines. Those skilled in the art will understand that these expanded views are simplified for descriptive purposes. In FIGS. 2A through 2F, a baseline flow path for tungsten replacement is illustrated. In FIG. 2A, a substrate 100 has a plurality of spaced oxide layers 110 with poly-Si layers between 120.

Figure 2B:
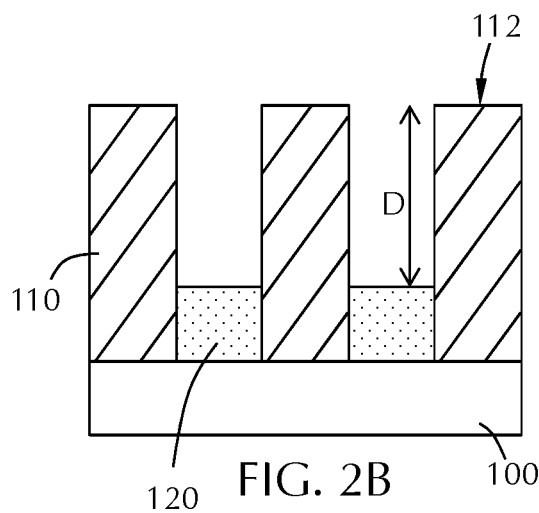
Figure 2C:
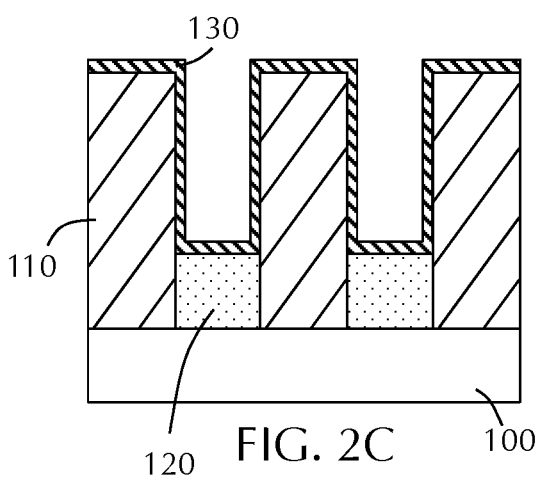

In FIG. 2B, the poly-Si layers 120 are recessed using an anisotropic etching process. The poly-Si layers 120 can be recessed a depth D below the surface 112 of the oxide layers 110. The depth D can be any suitable distance less than or equal to the thickness of the oxide layers 110. In some embodiments, the depth D is in the range of about 10% to about 90% of the thickness of the oxide layer 110. In some embodiments, the depth D is greater than or equal to about 10%, 20%, 30%, 40%, 50%, 60%, 70% or 80% of the thickness of the oxide layer 110.

In some embodiments, the recess depth D is substantially the same for all of the poly-Si layers 120. As used in this manner, the term "substantially the same" means that recess depth D of any of the layers 120 is in the range of about 80% to about 120% of the average recess depth D for all of the layers 120. In some embodiments, the recessed poly-Si layers 120 does not expose the memory string 17 or underlying substrate 100 shown in FIG. 2B.

In some embodiments, recessing the poly-Si layer comprises exposing the layer to an etchant comprising one or more of HF, $CF_x$, HCl, $Cl_2$, HBr, $Br_2$, $H_2$, or combinations thereof. The etchant can be diluted with or co-flowed with an inert gas (e.g., He, Ar, Xe, $N_2$). In some embodiments, recessing the poly-Si layer comprises a plasma to enhance the etch process, the plasma can be ICP, CCP, remote CCP, remote ICP, or remote plasma source (RPS). Pressure can vary from 0.1 to 100 Torr, and wafer temperature can be from −10 to 650° C.

After recessing the poly-Si layers 120, an optional liner 130 can be deposited. In some embodiments, a conformal liner 130 is formed on the oxide layers 110 and poly-Si layers 120. The liner 130 can be any suitable material. In some embodiments, the liner 130 comprises titanium nitride. In some embodiments, the liner 130 consists essentially of titanium nitride. As used in this manner, the term "consists essentially of titanium nitride" means that the composition of the liner is greater than or equal to about 95%, 98% or 99% titanium and nitrogen atoms, on an atomic basis. The thickness of the liner can be any suitable thickness. In some embodiments, the liner has a thickness in the range of about 10 Å to about 100 Å, or in the range of about 20 Å to about 50 Å. In some embodiments, the liner 130 improves the adhesion of a subsequent metal layer. In some embodiments, the liner 130 blocks fluorine diffusion during metal deposition.

In some embodiments, a TiN liner can be deposited by an ALD process. For example, sequential exposure to $TiCl_4$ and $NH_3$ plasma can be used in a time-domain ALD process or a spatial ALD process. Pressure can vary from 0.1 to 100 Torr, and wafer temperature can be from 300 to 650° C. It can be processed on single wafer chamber or spatial ALD chamber.

Figure 2D:
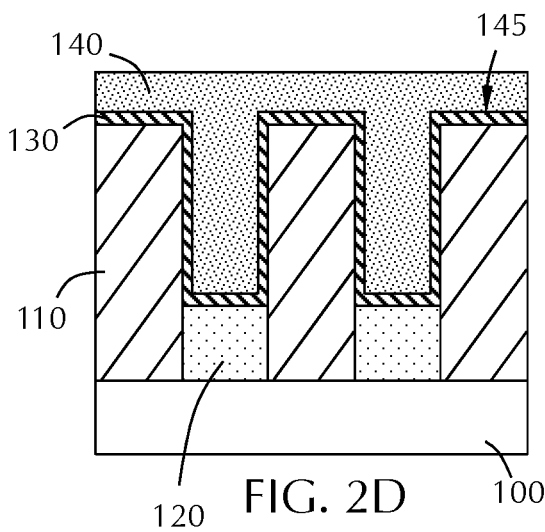

As shown in FIG. 2D, a metal 140 can be deposited and filled into the recessed portions of the poly-Si layer 120. The metal 140 fills the gaps and forms a layer of overburden 145. The overburden 145 is the material that is deposited outside of the gaps between the oxide layers 110. The overburden can by any suitable thickness depending on the process used to deposit the metal 140. In some embodiments, the overburden 145 has a thickness in the range of about 1 Å to about 1000 Å. In some embodiments, the overburden 145 has a thickness greater than or equal to about 5 Å, 10 Å, 15 Å, 20 Å, 25 Å, 30 Å, 35 Å, 40 Å, 45 Å or 50 Å.

The metal 140 can be any suitable metal used in wordline applications. In some embodiments, the metal film comprises tungsten. In some embodiments, the metal film excludes tungsten. In some embodiments, the metal film consists essentially of tungsten. As used in this regard, the term "consists essentially of tungsten" means that the composition of the bulk metal film is greater than or equal to about 95%, 98% or 99% tungsten on an atomic basis. The bulk metal film excludes the surface portions of the metal 140 that might contact another surface (e.g., the oxide surface) or is open for further processing as these areas may have some small amount of atomic diffusion with the adjacent material or have some surface moiety like a hydride termination.

In some embodiments, a conformal tungsten film can be deposited using an ALD process. In some embodiments, tungsten deposition comprises sequential exposure to a tungsten precursor and a reactant. In some embodiments, the tungsten precursor comprises one or more of $WF_6$, $WCl_5$, $WCl_6$ or combinations thereof. In some embodiments, the reactant comprises $H_2$.

In some embodiments, an area-selective tungsten fill process is used. The area-selective tungsten fill can be similar to a conformal tungsten deposition. Some embodiments use one or more of $WF_6$, $WCl_6$, $WCl_5$ or combinations thereof as a tungsten precursor. Some embodiments use one or more of $H_2$, $SiH_4$, $Si_2H_6$, $B_2H_6$ or combinations thereof as a reducing agent. Pressures can vary from 0.1 to 100 Torr and wafer temperature can vary from 0 to 650° C.

Figure 2E:
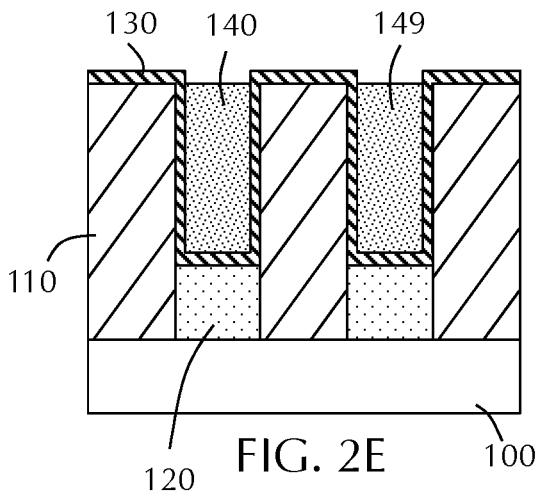

As shown in FIG. 2E, the overburden 145 can be etched away to separate the wordlines 149. In some embodiments, the etch process comprises a selective etch process that will remove the metal 140 without substantially affecting the liner 130.

After etching the metal overburden 145, the metal 140 remaining in the gaps between the oxide layers 110 forming wordlines 149 is substantially even with the sides of the stack. As used in this manner, the term "substantially even" means that the wordlines 149 within the gaps are within ±1

Figure 2F:
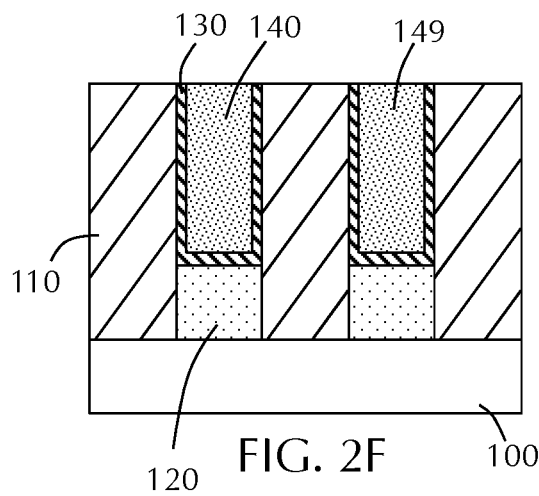

Å of the side of the stack. In some embodiments, as shown in FIG. 2F, the exposed liner 130 can be removed from the sides of the oxide layers 110.

Figure 3A:
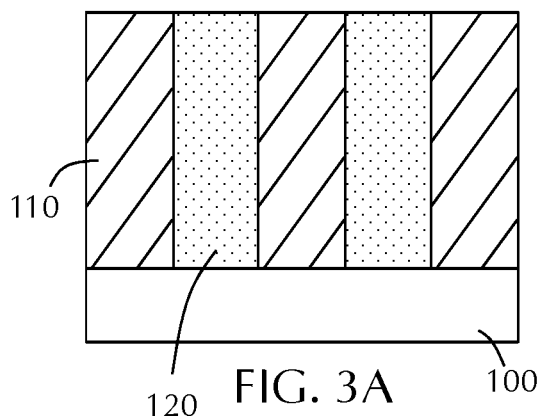
FIGS. 3A through 3C show a cross-sectional schematic of a process in accordance with one or more embodiments of the disclosure.
Figure 3B:
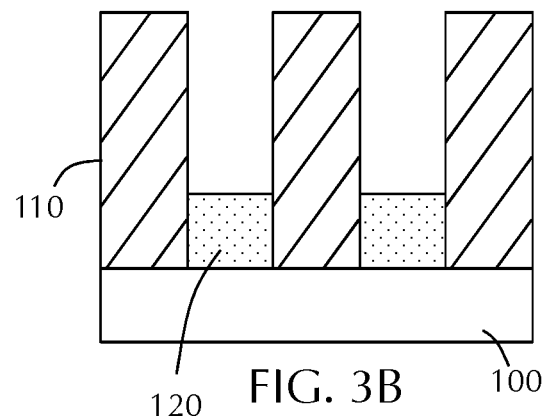
Figure 3C:
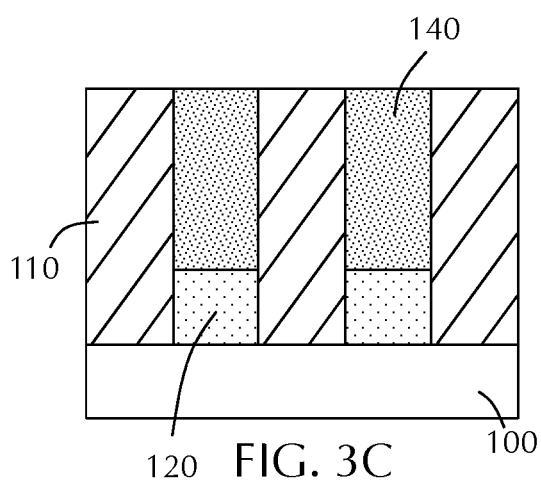

FIGS. 3A through 3C illustrate another embodiment of the disclosure. In this embodiment, FIGS. 3A and 3B are analogous to FIGS. 2A and 2B in which the poly-Si layer 120 is recessed a depth from the surface. After recessing the poly-Si layer 120, a metal 140 is formed directly in the recessed area using a selective atomic layer deposition (ALD) process. Tungsten, for example, can be deposited only on the poly-Si layer 120 but not on the oxide layer 110.

Figure 4A:
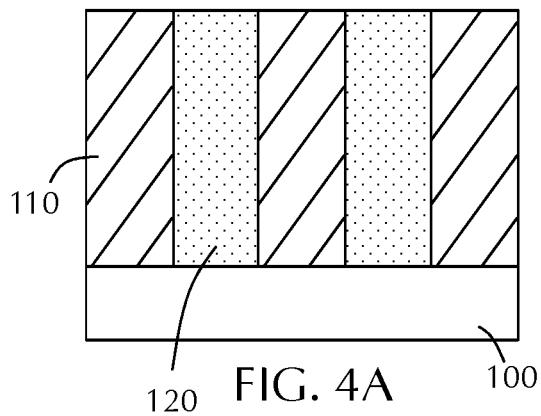
FIGS. 4A and 4B show a cross-sectional schematic of a process in accordance with one or more embodiments of the disclosure.
Figure 4B:
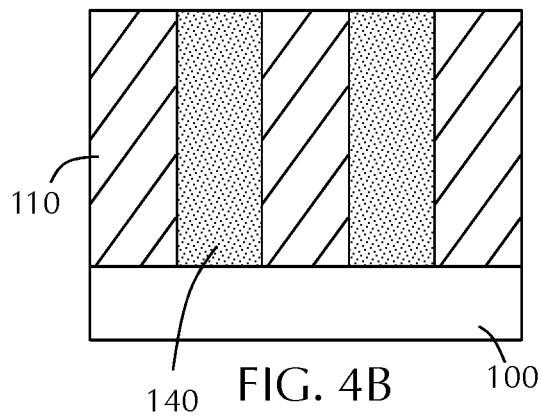

FIGS. 4A and 4B illustrate another embodiment of the disclosure in which a metal (e.g., tungsten) is directly filled into the wordline area by a conversion reaction. The poly-Si layer 120 in FIG. 4A can be exposed to a tungsten precursor comprising a tungsten halide compound that reacts with the silicon to form a volatile silylhalide and deposit a metallic tungsten layer.

In some embodiments, the tungsten precursor comprises $WF_6$. In some embodiments, exposure to the tungsten precursor occurs at a temperature in the range of about 300° C. to about 550° C. and a pressure in the range of about 10 T to about 100 T. The tungsten precursor can be co-flowed with other gases that can be diluent, carrier or inert gases (e.g., argon) or reactive gases (e.g., $H_2$). In some embodiments, the tungsten precursor is co-flowed with a reactive gas that promotes the reaction of the tungsten precursor with the recessed film.

In some embodiments, substantially all of the poly-Si film is converted to tungsten. As used in this regard, the term "substantially all" means greater than or equal to about 95%, 98% or 99% of the recessed film is converted to tungsten. The amount of time employed to convert substantially all of the film depends on, for example, the temperature, pressure, film composition, film thickness and tungsten precursor. In some embodiments, 200-300 Å of poly-Si can be converted to tungsten in less than about four minutes at 550° C. and 20 Torr.

Figure 5A:
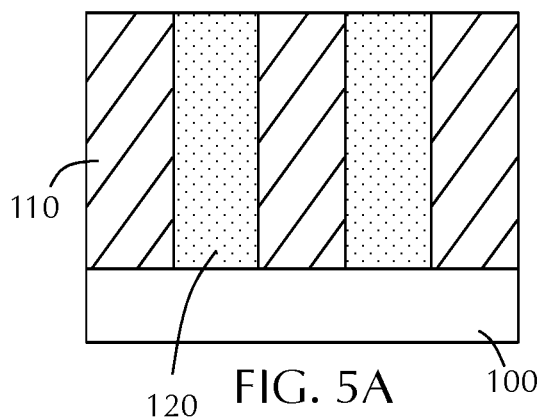
FIGS. 5A through 5D show a cross-sectional schematic of a process in accordance with one or more embodiments of the disclosure.
Figure 5B:
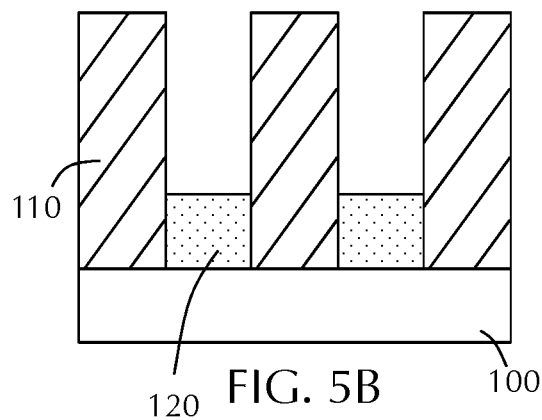
Figure 5C:
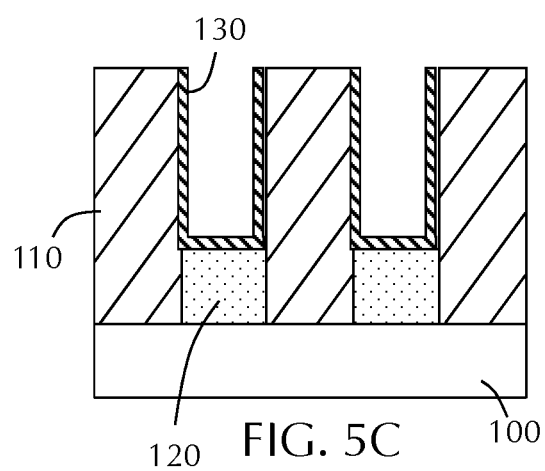
Figure 5D:
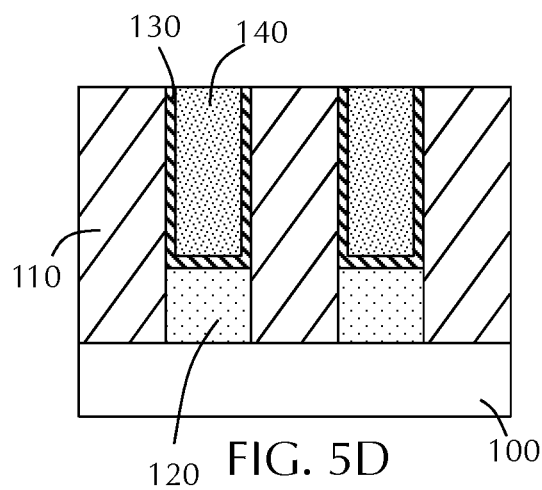

FIGS. 5A through 5D illustrate another embodiment of the disclosure. In this embodiment, FIGS. 5A and 5B are analogous to FIGS. 2A and 2B in which the poly-Si layer 120 is recessed a depth from the surface. After recessing the poly-Si layer 120, an oxide protection liner 130 can be formed within the gaps between the oxide layers 110, as shown in FIG. 5C. The metal 140 can then be formed directly in the recessed area, as shown in FIG. 5D.

The oxide protection liner 130 can be deposited by a selective process and/or conformal process. In some embodiments, the liner comprises one or more of TiN, TiSiN, TiAlN, $Al_2O_3$ or TaN. The deposition can be a one-step deposition process or a deposition-etch process.

Figure 6A:
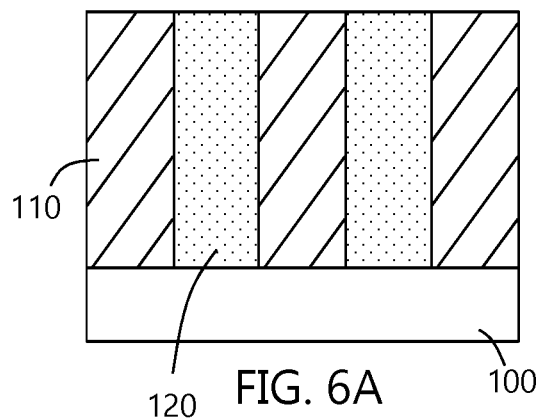
FIGS. 6A through 6E show a cross-sectional schematic of a process in accordance with one or more embodiments of the disclosure.
Figure 6B:
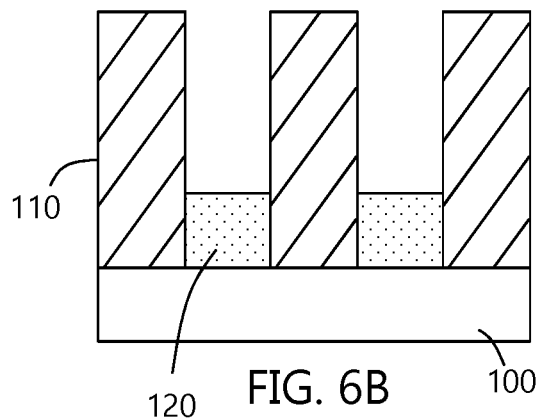
Figure 6C:
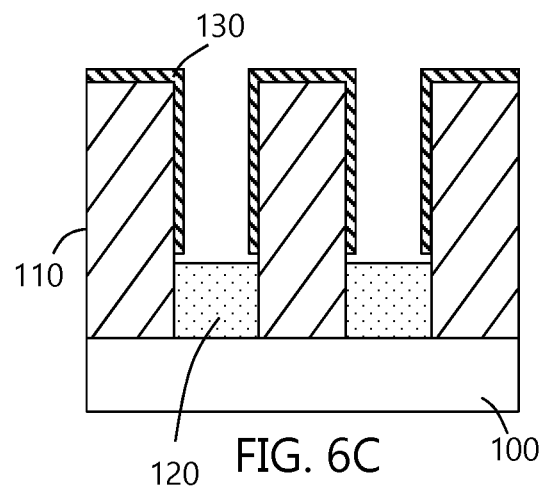
Figure 6D:
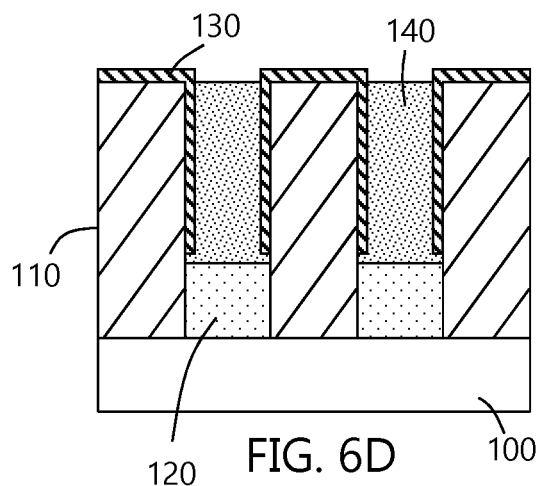
Figure 6E:
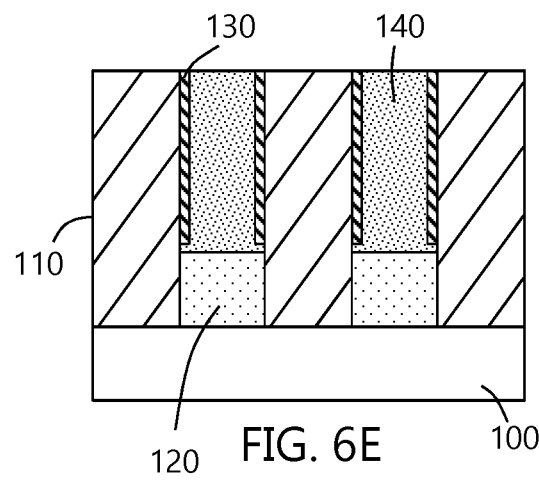

FIGS. 6A through 6E illustrate another embodiment of the disclosure. In this embodiments, FIGS. 6A and 6B are analogous to FIGS. 2A and 2B, respectively, in which the poly-Si layer 120 is recessed a depth from the surface. After recessing the poly-Si layer 120, a liner 130 is formed on the oxide layers 110 and not on the poly-Si layer 120, as shown in FIG. 6C. The metal 140 can be deposited in the recessed area, as shown in FIG. 6D. The liner 130 can then be removed from the exposed surface of the oxide layers 120, as shown in FIG. 6E.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   recessing a poly-Si layer in a gap between spaced oxide layers to a depth below a top surface of the spaced oxide layers to expose sides of the oxide layers within the gap;
   forming a liner on the top surface and the exposed sides of the spaced oxide layers and not directly on a top surface of the recessed poly-Si layer; and
   depositing a metal layer in the gap on the liner to form wordlines.

2. The method of claim 1, wherein the metal layer comprises tungsten.

3. The method of claim 2, wherein the metal layer consists essentially of tungsten.

4. The method of claim 2, wherein depositing the metal layer comprises exposing the substrate to a tungsten precursor and a reactant.

5. The method of claim 4, wherein the tungsten precursor comprises one or more of $WF_6$, $WCl_6$ or $WCl_5$ and the reactant comprises $H_2$.

6. The method of claim 1, wherein the liner comprises one or more of TiN, TiSiN, TiAlN, $Al_2O_3$ or TaN.

7. The method of claim 6, wherein the liner has a thickness in the range of about 20 Å to about 50 Å.

8. The method of claim 6, wherein forming the liner comprises sequential exposure to a titanium precursor and a nitrogen reactant.

9. The method of claim 8, wherein the titanium precursor comprises $TiCl_4$ and the reactant comprises $NH_3$.

10. The method of claim 1, wherein there are greater than 50 wordlines.

11. The method of claim 1, wherein recessing the poly-Si layer comprises exposing the substrate to an etchant comprising one or more of HF, $CF_x$, HCl, $Cl_2$, HBr, $Br_2$ or $H_2$.

12. The method of claim 11, wherein recessing the poly-Si layer comprises exposure to a plasma.

13. The method of claim 1, wherein the metal layer is substantially even with the spaced oxide layers.

14. A processing method comprising:
   providing a substrate surface with a plurality of spaced oxide layers with gaps between the spaced oxide layers and poly-Si layers in the gaps between the spaced oxide layers;
   recessing the poly-Si layer to a depth below a top surface of the spaced oxide layers to expose sides of the spaced oxide layers within the gap;
   forming a TiN liner on the top surface and the exposed sides of the spaced oxide layers and not directly on a top surface of the recessed poly-Si layer, the liner having a thickness in the range of about 20 Å to about 50 Å; and
   depositing a tungsten layer in the gaps on the liner to form wordlines, depositing the tungsten layer comprises exposing the substrate to a tungsten precursor and a reactant, the tungsten precursor comprises one or more of $WF_6$, $WCl_6$ or $WCl_5$ and the reactant comprises $H_2$.

* * * * *